US012780041B2

(12) United States Patent
Bhandary

(10) Patent No.: US 12,780,041 B2
(45) Date of Patent: Nov. 3, 2026

(54) PREDICTION OF AGEING OF ELECTRICAL ENERGY STORAGES

(71) Applicant: VOLVO TRUCK CORPORATION, Gothenburg (SE)

(72) Inventor: Dhiraj P Bhandary, Santhekatte (IN)

(73) Assignee: VOLVO TRUCK CORPORATION, Gothenburg (SE)

( * ) Notice: Subject to any disclaimer, the term of this patent is extended or adjusted under 35 U.S.C. 154(b) by 394 days.

(21) Appl. No.: 18/509,610

(22) Filed: Nov. 15, 2023

(65) Prior Publication Data

US 2024/0190292 A1 Jun. 13, 2024

(30) Foreign Application Priority Data

Dec. 7, 2022 (EP) .................................... 22211954

(51) Int. Cl.

| | |
|---|---|
| ***B60L 58/16*** | (2019.01) |
| ***G01R 31/36*** | (2020.01) |
| ***G01R 31/367*** | (2019.01) |
| ***G01R 31/385*** | (2019.01) |
| ***G01R 31/392*** | (2019.01) |

(52) U.S. Cl.

CPC ............ *B60L 58/16* (2019.02); *G01R 31/367* (2019.01); *G01R 31/385* (2019.01); *G01R 31/392* (2019.01); *G01R 31/36* (2013.01); *H01M 2220/20* (2013.01); *Y02E 60/10* (2013.01)

(58) Field of Classification Search

CPC ..... B60L 58/16; G01R 31/367; G01R 31/385; G01R 31/392; G01R 31/36; Y02E 60/10; H01M 2220/20

See application file for complete search history.

(56) References Cited

U.S. PATENT DOCUMENTS

| | | | | |
|---|---|---|---|---|
| 2017/0045587 A1 | | 2/2017 | Kim et al. | |
| 2020/0225291 A1 | * | 7/2020 | Hinterberger | G01R 31/389 |
| 2021/0148985 A1 | * | 5/2021 | Yoon | G01R 31/3835 |
| 2023/0033057 A1 | * | 2/2023 | Arzberger | G01R 31/367 |
| 2023/0176137 A1 | * | 6/2023 | Petisme | G01R 31/392 702/63 |

FOREIGN PATENT DOCUMENTS

| | | | | | |
|---|---|---|---|---|---|
| CN | 115128493 A | | 9/2022 | | |
| DE | 102016222126 A1 | | 5/2018 | | |
| EP | 3671244 A1 | | 6/2020 | | |
| WO | 2021213654 A1 | | 10/2021 | | |
| WO | WO-2022171993 A1 | * | 8/2022 | | G01R 31/374 |

OTHER PUBLICATIONS

Battery University (BU-908: Battery Management System (BMS), BatteryUniversity.com, Nov. 4, 2021) (Year: 2021).*

Extended European Search Report in corresponding European Application No. 22211954.7 dated Jun. 6, 2023 (8 pages).

* cited by examiner

*Primary Examiner* — Christian T Bryant

(74) *Attorney, Agent, or Firm* — Jeffri A. Kaminski; Venable LLP

(57) ABSTRACT

The disclosure relates generally to electrical energy storages. In particular aspects, the disclosure relates to prediction of ageing of electrical energy storages. The disclosure can be applied in heavy-duty vehicles, such as trucks, buses, and construction equipment.

17 Claims, 8 Drawing Sheets

PREDICTION OF AGEING OF ELECTRICAL ENERGY STORAGES

TECHNICAL FIELD

The disclosure relates generally to electrical energy storages. In particular aspects, the disclosure relates to prediction of ageing of electrical energy storages. The disclosure can be applied in heavy-duty vehicles, such as trucks, buses, and construction equipment. Although the disclosure may be described with respect to a particular vehicle, the disclosure is not restricted to any particular vehicle.

BACKGROUND

Electrical energy storages such as batteries undergo ageing that degrade their performance over time. The different cells in a single battery pack as well as in multiple pack battery tend to age differently due to various reasons, including initial variation in cell capacity, resistance, and thermal heat transfer properties due to manufacturing tolerances.

Predicting cell ageing, or so-called state of health is important with regards to taking appropriate actions for extending the lifetime of an entire battery pack. It is therefore of interest to improve ageing predictions for batteries.

SUMMARY

According to a first aspect of the disclosure, there is provided a computer system comprising a processor device configured to: retrieve reference data of a reference cell, the reference data including at least one initial ageing parameter at beginning of life of the reference cell, and usage conditions of the reference cell including usage condition values, measure at least one initial ageing parameter of each electrical energy storage cell of an electrical energy storage system at beginning of life of each electrical energy storage cell, and at least one usage condition value for each electrical energy storage cell; calculate a first similarity value that indicates a relative relationship between one initial ageing parameter for each electrical energy storage cell and the corresponding initial ageing parameter at beginning of life of the reference cell, calculate a second similarity value that indicates a relative relationship between one usage condition value for each electrical energy storage cell and the corresponding usage condition value of the reference cell, determine a final similarity value for each electrical energy storage cell based on all similarity values of the respective electrical energy storage cell, predict an ageing evolution of each electrical energy storage cell based on the final similarity values, and provide data indicating the ageing evolution of each electrical energy storage cell.

The first aspect of the disclosure may seek to predict the ageing behavior of an electrical energy storage cell more accurately. A technical benefit may include improving the lifetime of an electrical energy storage pack comprising multiple electrical energy storage cells.

In a second aspect, there is provided a computer-implemented method, comprising: retrieving, by a processor device of a computer system, reference data of a reference cell, the reference data including at least one initial ageing parameter at beginning of life of the reference cell, and usage conditions of the reference cell including usage condition values, measuring, by the processor device, at least one initial ageing parameter of each electrical energy storage cell of an electrical energy storage system at beginning of life of each electrical energy storage cell, and at least one usage condition value for each electrical energy storage cell; calculating, by the processor device, a first similarity value that indicates a relative relationship between one measured initial ageing parameter for each electrical energy storage cell and the corresponding initial ageing parameter at beginning of life of the reference cell, calculating, by the processor device, a second similarity value that indicates a relative relationship between one usage condition value for each electrical energy storage cell and the corresponding usage condition value of the reference cell, determining, by the processor device, a final similarity value for each electrical energy storage cell based on all similarity values of the respective electrical energy storage cell, predicting, by the processor device, an ageing evolution of each electrical energy storage cell based on the final similarity values, and providing, by the processor device, data indicating the ageing evolution of each electrical energy storage cell.

The second aspect of the disclosure may seek to predict the ageing behavior of an electrical energy storage cell more accurately. A technical benefit may include improving the lifetime of an electrical energy storage pack comprising multiple electrical energy storage cells.

In some examples, the similarity values for each cell are stored in an indexed way to associate each cell with their similarity values. This provides for a more efficient calculation of the final similarity value, and for backtracking to evaluate evolution of individual similarity values for individual cells.

In some examples, the method may comprise adapting control strategies for a management system of the electrical energy storage system using the predicted ageing evolution as input to reduce an ageing pace of the electrical energy storage system. Thus, suitable control strategies may advantageously be applied to prolong the lifetime of the electrical energy storage system.

In some examples, the location of the electrical energy storage cell in the electrical energy storage system relative to the other electrical energy storage cells may include one index for the position of the cell in the energy storage system indicative of the pack (pth pack), within the pack indicative of the module (mth module) of the pack, and within the module indicating ith row out of ns cells in series, jth column out of np cells in parallel. Thus, a structured way to keep track of each cell is provided.

In some examples, the initial ageing parameter is one of initial capacity, initial resistance, and initial heat transfer coefficient of the respective cell. These parameters advantageously provide for appropriate parameters that are measurable to evaluate ageing of the electrical energy storage cells of the electrical energy storage parameters, where ageing may be referred to as so-called state of health measured by means of the above parameters. State of health may be State of Health Resistance (SOHR) or State of Health Capacity (SOHC).

In some examples, method may comprise calculating a similarity value for at least two of the initial ageing parameters included in the reference data. Including further ageing parameters provide for a more accurate ageing evolution prediction.

In some examples, the method may comprise calculating a similarity value for each of the initial ageing parameters included in the reference data.

In some examples, the usage conditions may include temperature of the cell, operating voltage, operating electric current, energy throughput, current throughput, and ambient temperature, for each cell. These parameters affect ageing of electrical energy storage cells and provide for improve accuracy of the ageing evolution prediction.

In some examples, the method may comprise calculating a similarity value for at least two of the usage conditions. Including further usage conditions parameters provide for a more accurate ageing evolution prediction.

In some examples, the method may comprise calculating a similarity value for each of the usage conditions.

In some examples, the method may comprise applying a physical model of the electrical energy storage system layout including active or passive coolant flow for modelling a temperature of each electrical energy storage cell as a function of position of the electrical energy storage cell in the electrical energy storage system, and calculating the corresponding similarity values based on relative relationships between the modelled temperatures of each cell compared to the temperature of the reference cell according to the retrieved usage condition data. A physical model may advantageously provide the effect that improved estimations of the temperature of each cell can be provided.

In some examples, the method may comprise determining, by the processor device, the final similarity value for each cell by a weighted sum of the similarity values of the respective cell. This provides for a simple yet accurate and efficient way to calculate the final similarity value that takes into accounts all the similarity values and their relative importance.

In some examples, each electrical energy storage cell is assigned a unique similarity value. The uniqueness is that each similarity value is associated with a location index in the electrical energy storage system.

In some examples, the method may comprise processing final similarity values for at least two different electrical energy storage cells and calculating differential ageing between at least two electrical energy storage cells from the outcome of the processing.

In some examples, the reference data may include initial ageing parameters being initial capacity, initial resistance, and initial heat transfer coefficient of the respective cell, and, the usage conditions may include temperature, operating voltage, operating current, energy throughput, current throughput, and ambient temperature for each cell, the method may further comprise: calculating a similarity value for each of the initial ageing parameters, calculating a similarity value for each of the usage conditions; and adapting control strategies for a management system of the electrical energy storage system using the predicted ageing evolution as input to reduce an ageing pace of the electrical energy storage system.

There is further provided a vehicle comprising the processor device to perform the method of the second aspect.

There is further provided a computer program product comprising program code for performing, when executed by the processor device, the method of the second aspect.

There is further provided a control system comprising one or more control units configured to perform the method of the second aspect.

There is further provided a non-transitory computer-readable storage medium comprising instructions, which when executed by the processor device, cause the processor device to perform the method of the second aspect.

The above aspects, accompanying claims, and/or examples disclosed herein above and later below may be suitably combined with each other as would be apparent to anyone of ordinary skill in the art.

Additional features and advantages are disclosed in the following description, claims, and drawings, and in part will be readily apparent therefrom to those skilled in the art or recognized by practicing the disclosure as described herein. There are also disclosed herein control units, computer readable media, and computer program products associated with the above discussed technical benefits.

BRIEF DESCRIPTION OF THE DRAWINGS

With reference to the appended drawings, below follows a more detailed description of aspects of the disclosure cited as examples.

DETAILED DESCRIPTION

Aspects set forth below represent the necessary information to enable those skilled in the art to practice the disclosure.

Figure 1:
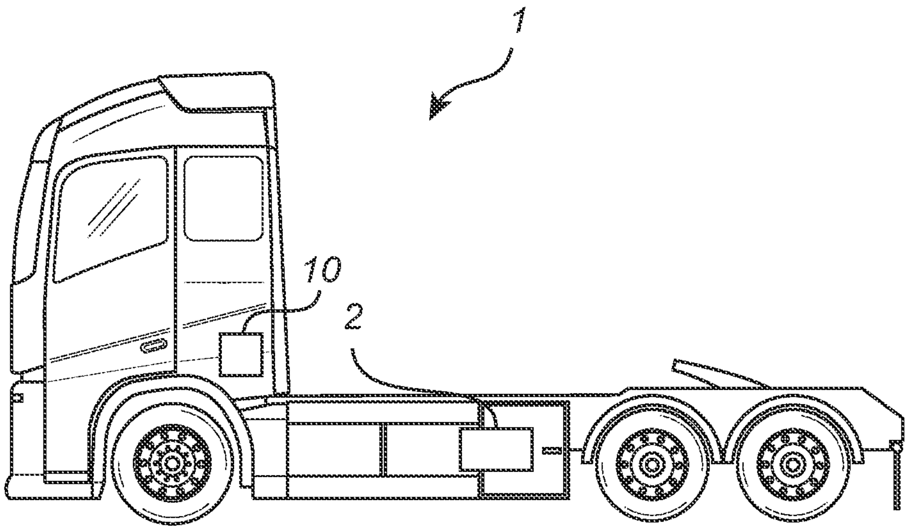
FIG. 1 is a vehicle in the form of an electrical truck according to one example of the present disclosure.

FIG. 1 illustrates a vehicle in the form of an electrical truck 1 comprising a rechargeable propulsion electrical energy storage system 2 generally comprising a plurality of series and parallel connected electrical energy storage cells. The propulsion electrical energy storage 2 is arranged to provide power to an electrical engine (not shown) arranged for providing propulsion for the electrical truck 1. The electrical truck 1 further comprises an electrical energy storage managing system 10 which is configured to monitor electrical energy storage cell characteristics such as state of charge (SOC), state of health (SOH), state of power (SOP), state of energy (SOE), state of capacity (SOQ), electrical energy storage voltage, state of resistance (SOR) i.e., internal impedance, and optionally temperature of the electrical energy storage cells. The propulsion electrical energy storage system 2 may be a Li-ion electrical energy storage comprising multiple packs with cells electrically connected in series and in parallel.

Although the vehicle in FIG. 1 is depicted as a heavy-duty truck, embodiments of the present disclosure may as well be implemented in other types of vehicles, such as in buses, light-weight trucks, passenger cars, construction equipment, industrial applications, and marine applications including e.g. vessels or ships.

Electrical energy storage cells tend to age in-homogenously due to initial variation in cell capacity, resistance, thermal heat transfer properties due to manufacturing tolerances. In addition, different conditions during usage like variation in voltage, cooling characteristics due to the coolant flow layout can further lead to differential ageing between the different cells. Most traditional ageing models only consider a single cell. However, for an application employing a pack with multiple cells, the single cell-based SOH prediction may be suboptimal leading to further suboptimal control of thermal/electric systems for control strategies of the electrical energy storages. This may lead to that the cell with worst ageing may be the performance limiter for the entire pack or the entire electrical energy storage system thereby leading to suboptimal performance. The present disclosure provides a statistical approach to predict the ageing for each cell in the electrical energy storage system to enable better control of the of thermal/electric systems for control strategies of the electrical energy storages.

Figure 2:
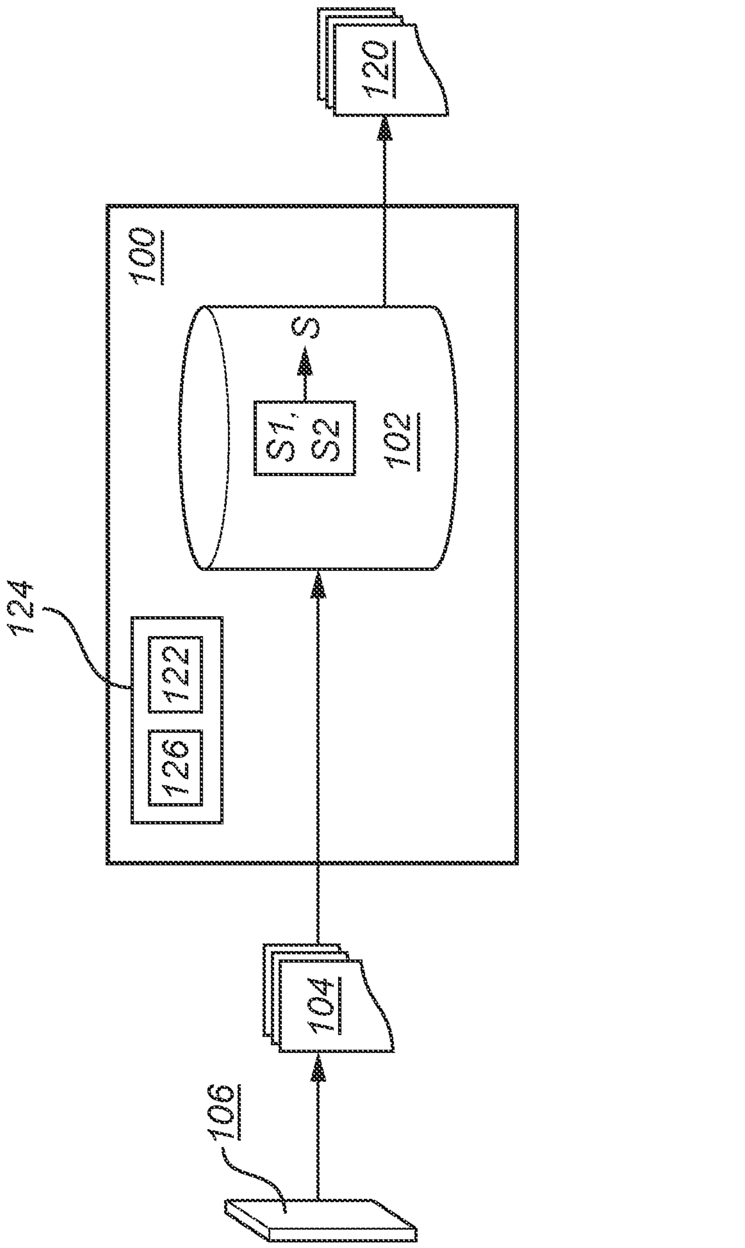
FIG. 2 is an exemplary system diagram of a computer system according to one example.

FIG. 2 is an exemplary system diagram of a computer system 100 according to one example. The computer system 100 comprises a processor device 102 configured to retrieve reference data 104 of a reference cell 106. The reference data 104 includes at least one initial ageing parameter at beginning of life of the reference cell 104, and usage conditions of the reference cell 106 including usage condition values.

The processor device 102 is configured to measure at least one initial ageing parameter of each electrical energy storage cell of an electrical energy storage system 2 at beginning of life of each electrical energy storage cell, and at least one usage condition value for each electrical energy storage cell.

The processor device 102 is configured to calculate a first similarity value S1 that indicates a relative relationship between one initial ageing parameter for each electrical energy storage cell and the corresponding initial ageing parameter at beginning of life of the reference cell.

The processor device 102 is configured to calculate a second similarity value S2 that indicates a relative relationship between one usage condition value for each electrical energy storage cell and the corresponding usage condition value of the reference cell.

The processor device 102 is configured to determine a final similarity value S for each electrical energy storage cell based on all similarity values S1, S2 of the respective electrical energy storage cell.

The processor device 102 is configured to predict an ageing evolution of each electrical energy storage cell based on the final similarity values.

The processor device 102 is configured to provide data 120 indicating the ageing evolution of each electrical energy storage cell.

The reference electrical energy storage cell 106 is a reference cell used for performing ageing tests for producing an empirical model for ageing or state of health. The reference electrical energy storage cell 106 is a separate cell that is not part of the electrical energy storage system under evaluation.

Figure 3:
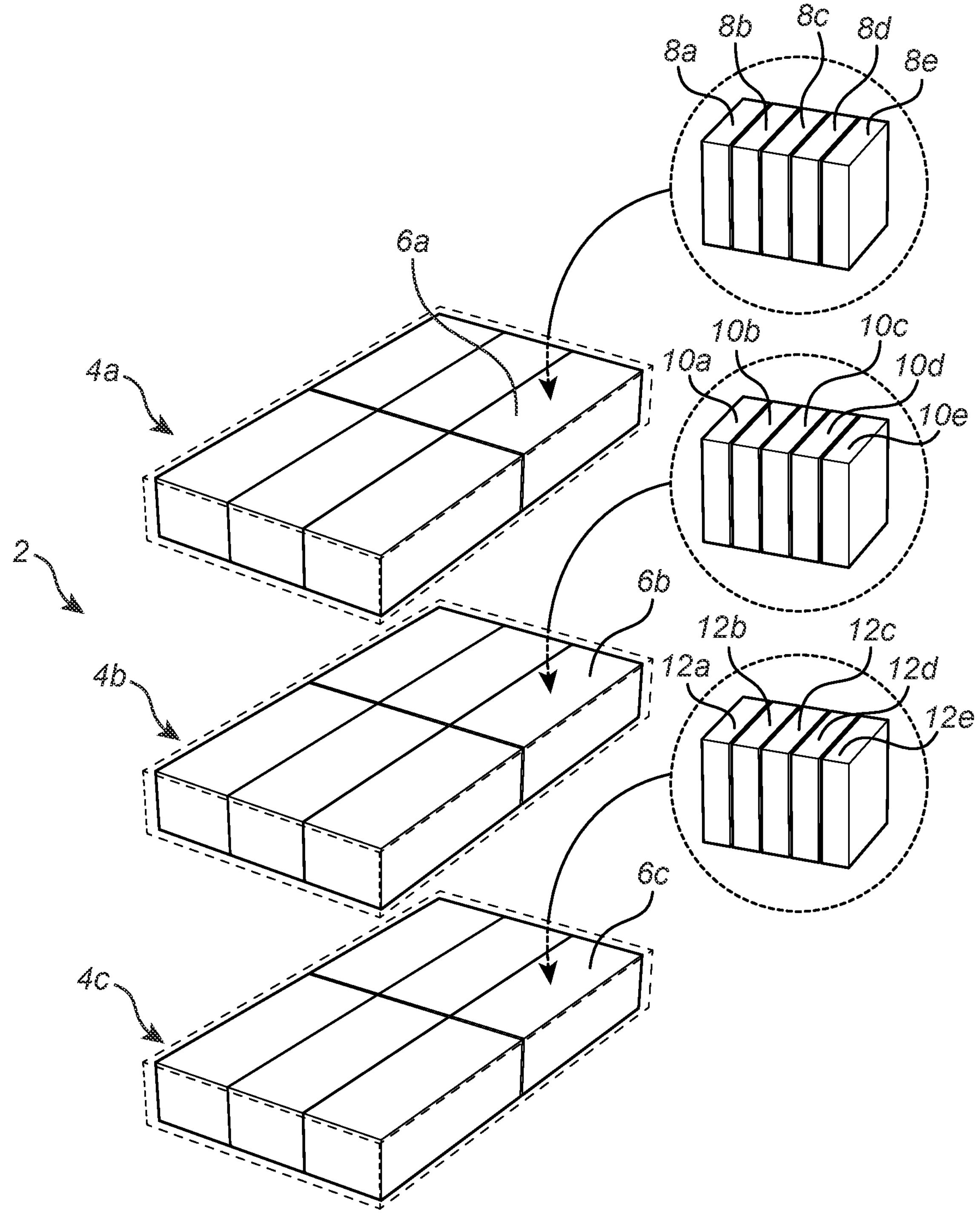
FIG. 3 schematically illustrates an electric energy storage system.

FIG. 3 schematically illustrates an example electrical energy storage system 2. The electrical energy storage system 2 comprises a set of electrical energy storage packs 4*a*, 4*b*, 4*c* that are electrically connected in series or in parallel to produce an output traction voltage to an electrical motor.

Each of the electrical energy storage packs 4*a*, 4*b*, 4*c*, or generally p, comprise a set of electrical energy storage modules 6*a*, 6*b*, 6*c*, generally m. Within each electrical energy storage pack, the electrical energy storage modules 6*a*, 6*b*, 6*c*, of each pack are electrically connected in series or parallel to produce an output voltage from the respective electrical energy storage pack 6*a*, 6*b*, 6*c*.

Within each electrical energy storage module 6*a*, 6*b*, 6*c*, a set of electrical energy storage cells are arranged. Here, electrical energy storage module 6*a* is exemplified as comprising electrical energy storage cells 8*a*, 8*b*, 8*c*, 8*d*, 8*e*, electrical energy storage module 6*b* is exemplified as comprising electrical energy storage cells 10*a*, 10*b*, 10*c*, 10*d*, 10*e*, and electrical energy storage module 6*c* is exemplified as comprising electrical energy storage cells 12*a*, 12*b*, 12*c*, 12*d*, and 12*c*.

Generally, the location of an electrical energy storage cell in the electrical energy storage system 2 relative the other electrical energy storage cells 8*a-e*, 10*a-e*, 12*a-e* includes one index for the position of the cell in the energy storage system indicative of the pack (pth pack), within the pack indicative of the module (mth module) of the pack, and within the module indicating ith row out of ns cells in series, jth column out of np cells in parallel. Thus, each electrical energy storage cell 8*a-e*, 10*a-e*, 12*a-e* may be assigned a unique location index.

Figure 4:
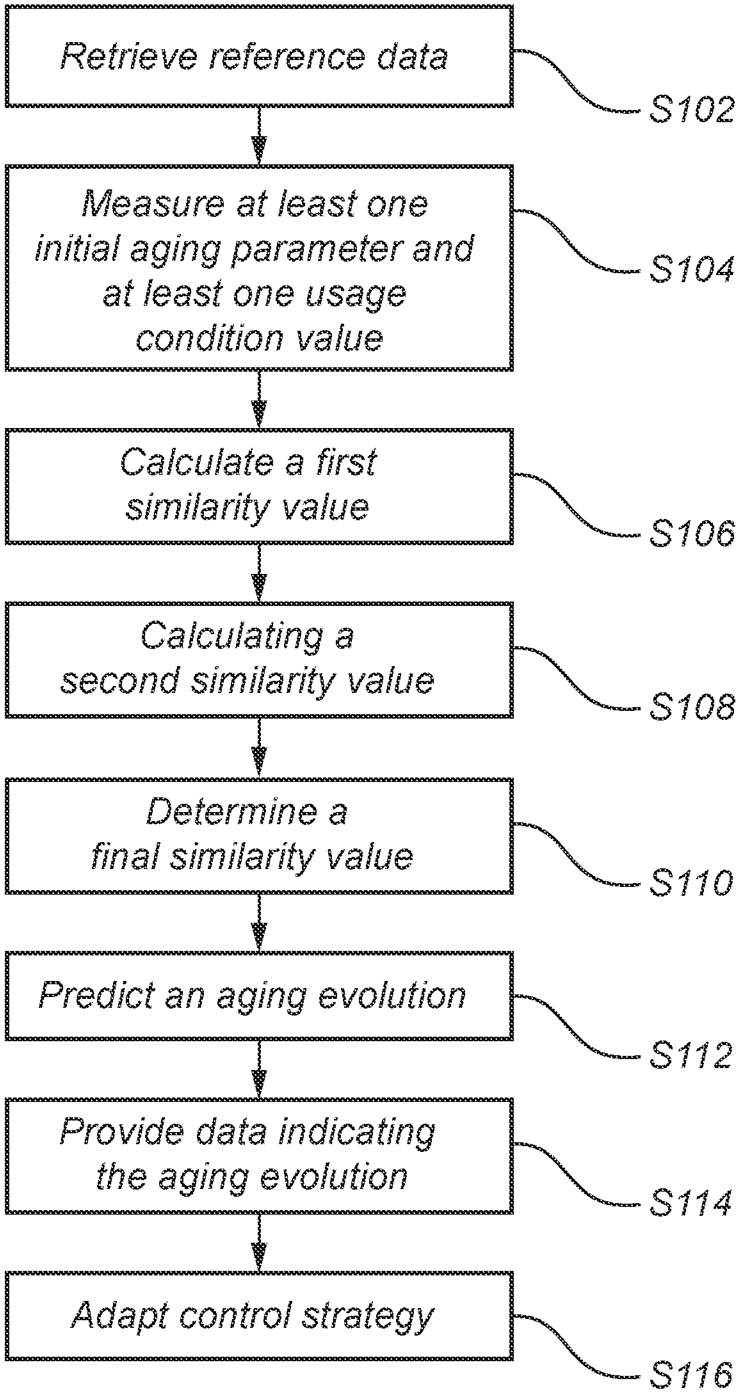
FIG. 4 is a flow chart of an exemplary method to predict ageing of a cell according to one example.

FIG. 4 is a flow-chart of method steps according to one example of a computer-implemented method for predicting ageing evolution of an electrical energy storage cell.

In step S102, retrieving, by a processor device 102 of a computer system 100, reference data 104 of a reference cell 106. The reference data 104 including at least one initial ageing parameter at beginning of life of the reference cell, and usage conditions of the reference cell including usage condition values. The initial ageing parameter such as the initial capacity, the initial resistance etc., are generally measured at reference temperatures which includes high temperatures, low temperatures and room temperature i.e. 25° C.

Although various initial ageing parameters are envisaged, some suitable examples include at least one of initial capacity, initial internal resistance, and initial heat transfer coefficient of the respective cell. The initial ageing parameters are physical parameters that described the physical condition and performance of the cell at beginning of life.

Furthermore, various usage conditions are envisaged, and some examples include a temperature of the cell, operating voltage, operating electrical current, energy throughput, electrical current throughput, and ambient temperature. The usage condition indicates the usage performance of the cell, e.g., how mildly or harshly the cell is being used.

In step S104, measuring, by the processor device 102, at least one initial ageing parameter Pi of each electrical energy storage cell 8*a-c*, 10*a-e*, 12*a-e* of an electrical energy storage system 2 at beginning of life of each electrical energy storage cell, and at least one usage condition value Ui for each electrical energy storage cell 8*a-e*, 10*a-c*, 12*a-c*. The at least one usage condition value Ui may be the present usage condition value Ui at the time of evaluation of the ageing behavior.

In step S106, calculating, by the processor device 102, a first similarity value S1 that indicates a relative relationship between one measured initial ageing parameter for each electrical energy storage cell 8*a-e*, 10*a-e*, 12*a-e* and the corresponding initial ageing parameter at beginning of life of the reference cell 106. This first similarity value S1 provides a reference baseline for the ageing evolution for the respective electrical energy storage cell 8*a-c*, 10*a-c*, 12*a-c*. That is, a value S1 that indicates the starting point for ageing relative the reference cell 106. The same reference cell is used for determining all the similarity values for all the electrical energy storage cells 8*a-c*, 10*a-c*, 12*a-c*.

In step S108, calculating, by the processor device 102, a second similarity value S2 that indicates a relative relationship between one usage condition value for each electrical energy storage cell 8*a-e*, 10*a-c*, 12*a-e* and the corresponding usage condition value of the reference cell.

In example, a similarity value is calculated for at least two of the initial ageing parameters included in the reference data. That is a similarity value is calculated for at least two of initial capacity, initial internal resistance, and initial heat transfer coefficient of the respective electrical energy storage cell 8*a-e*, 10*a-e*, 12*a-c*. In some examples, a similarity value is calculated for each of the initial ageing parameters included in the reference data.

Furthermore, in some examples, a similarity value is calculated for at least two of the usage conditions. That is, a similarity value is calculated for at least two of a temperature of the cell, an operating voltage, an operating current, energy throughput, electrical current throughput, and ambient temperature. In some examples, a similarity value is calculated for each of the usage conditions. That is, a separate similarity value is calculated for each and every of a temperature, operating voltage, operating current, energy throughput, electrical current throughput, and ambient temperature of the electrical energy storage cell 8*a-e*, 10*a-e*. 12*a-e*. The usage conditions of the cells indicate a present usage conditions.

In step S110, determining, by the processor device 102, a final similarity value S for each electrical energy storage cell 8*a-e*, 10*a-e*, 12*a-e* based on all similarity values of the respective electrical energy storage cell 8*a-e*, 10*a-e*, 12*a-e*. In one example, determining, by the processor device 102, the final similarity value S for each electrical energy storage cell 8*a-e*, 10*a-e*, 12*a-e* as a weighted sum of the similarity values of the respective electrical energy storage cell 8*a-e*, 10*a-e*, 12*a-e*.

For example, each similarity value is assigned a weight based on its relative importance compared to other similarity values. As a simple example, assign weight A for similarity value S1, weight B is assigned for similarity value S2, then the final similarity value S is S(p,m,i,j)=A*S1(p,m,i,j)+B*S2(p,m,i,j). The weights are typically selected based on the impact of the specific similarity value, e.g., S1, S2, has on the ageing evolution. For example, a higher impact on ageing will result in a higher weight, and a lower impact will result in a lower weight.

In step S112, predicting, by the processor device 102, an ageing evolution of each electrical energy storage cell 8*a-e*, 10*a-e*, 12*a-e* based on the final similarity values. The ageing evolution is the ageing compared to the reference cell 106 and is used as a measure for determining the relative ageing of a specific electrical energy storage cell, e.g., any one of electrical energy storage cell 8*a-e*, 10*a-e*, 12*a-e* compared to any other one electrical energy storage cells 8*a-e*, 10*a-e*, 12*a-e*.

In step S114, providing, by the processor device, data 120 indicating the ageing evolution of each electrical energy storage cell. This data 120 may be provided to a user interface for further processing.

In one example, here provided as step S116, adapting, by the processor device 102, control strategies for a management system of the electrical energy storage system using the predicted ageing evolution as input to reduce an ageing pace of the electrical energy storage system.

The processor device 102 may control for example a battery management system for the electrical energy storage cells 8*a-e*, 10*a-e*, 12*a-e*. The control strategies 122 may be specifically adapted to reduce ageing of the electrical energy storage cells 8*a-e*, 10*a-e*, 12*a-e*. The processor device 102 may have access to a set of pre-determined control strategies 122 that are stored in a memory storage device 124. For example, the processor device 102 may evaluate the final similarity value and compare it to a set of predetermined conditions or thresholds, and based on outcome of the evaluation, select one of the control strategies 122 from the memory 124. The control strategies may depend on the severity of the ageing evolution, such as an absolute level of ageing, e.g., SOHC or SOHR, or the pace of ageing, that is, the rate of deterioration.

Generally, the processor device 102 has access to individual processor devices of each electrical energy storage pack 4*a-c*. The final similarity values give an indication of the SOH of the electrical energy storage cells in an electrical energy storage pack and the spread in SOH. The processor device 102 can then control the pack or module based on the worst cell which is generally the limiting factor in the pack or module. The control strategy may be selected based on this weakest link.

A control strategy may be adapted once operative. Thus, it is envisaged that a presently used control strategy is adjusted in response to the value of the final similarity value. A control strategy may comprise of a set of controllable parameters that alter the performance or output from the electrical energy storage cells 8*a-c*, 10*a-e*, 12*a-c*. Thus, if one of the controllable parameters is adjusted, the output voltage and/or current of the electrical energy storage system 2 may be altered. Further, at least one controllable parameter of the control strategies 122 may vary the operating conditions of the electrical energy storage cells 8*a-c*, 10*a-c*, 12*a-e*. One such operating condition is the temperature of the electrical energy storage cells 8*a-c*, 10*a-c*, 12*a-c*.

The controllable parameters of the control strategies 122 include voltage output, electrical current output, that is, the control strategies may be used for adjusting the voltage output and/or electrical current output of the electrical energy storage system 2. The controllable parameters of the control strategies 122 may include limits on voltage output and/or current output, state of charge upper limit, and state of charge lower limit. The controllable parameters of the control strategies 122 may include limits on charging rate, adjusting allowable operating temperature range of the electrical energy storage cells 8*a-c*, 10*a-c*, 12*a-c*.

The processing device 102 may process the similarity values for at least two different electrical energy storage cells and calculate differential ageing between at least two electrical energy storage cells from the outcome of the processing. That is, by comparing similarity values for two or more different electrical energy storage cells 8*a-c*, 10*a-c*, 12*a-c*, the processor device 102 may conclude the relative ageing between the electrical energy storage cells 8*a-c*, 10*a-c*, 12*a-e*. The processing device 102 may apply different control strategies to different electrical energy storage cells 8*a-e*, 10*a-e*, 12*a-e* depending on the relative ageing.

Differential ageing is calculated using information from reference data of the reference cell. As an example, in the logged histogram of usage conditions for a particular trip or particular day, if the mean temperature is 15 degrees higher than for the reference cell, then the ageing for the same energy throughput as in reference cell may be determined to be, for example 20% higher. Purely as an example, if the SOH of the reference cell has dropped from 99% to 98% in a particular hypothetical trip (SOH does not in reality drop so fast in one trip) under reference usage conditions, then the SOH of the present cell will drop from 99% to 97.8% (20% faster) for the same trip/energy throughput.

The temperature of electrical energy storage cells may differ based on its location in the electrical energy storage system. For example, a first electrical energy storage cell close to coolant output may be for example 15 degrees higher than the indicated temperature in the reference data for the reference cell, whereas a second electrical energy storage cell close to coolant input could be 10 degrees higher than the reference cell due to better cooling close to the input. Hence, the first cell could age 20% faster that the reference cell for the trip and the second cell could deteriorate 12-15% faster for the same trip.

In this way, if the differential ageing is determined after every trip or every day or even every week, the SOH could be updated at the same frequency by determining the delta SOH and then subtracting it from previous value, that is $SOH_{new}=SOH_{old}-\Delta_{SOH}$.

To better determine the usage conditions for the electrical energy storage cells 8*a-e*, 10*a-c*, 12*a-e*, the processing device 102 may apply a physical model 126 of the electrical energy storage system 2 layout including active coolant flow, or in some cases passive coolant flow. Using the model 126 that may be stored in the memory storage device 124, the processing device 102 models a temperature of each electrical energy storage cell 8*a-e*, 10*a-e*, 12*a-e* as a function of position of the electrical energy storage cells 8*a-c*, 10*a-e*, 12*a-e* in the electrical energy storage system 2. The processor device 102 is configured to calculate the corresponding similarity values based on relative relationships between the modelled temperatures of each electrical energy storage cell 8*a-e*, 10*a-e*, 12*a-e* compared to the temperature of the reference cell 106 according to the retrieved usage condition data 104.

Determining usage conditions for evaluating the ageing of the electrical energy storage cells may be performed at regular intervals, such as once a day, or after each trip. For example, histograms of cell temperatures, operating voltages, operating currents, and ambient temperatures for the particular trip or particular day may be used for determining usage conditions.

Figure 5:
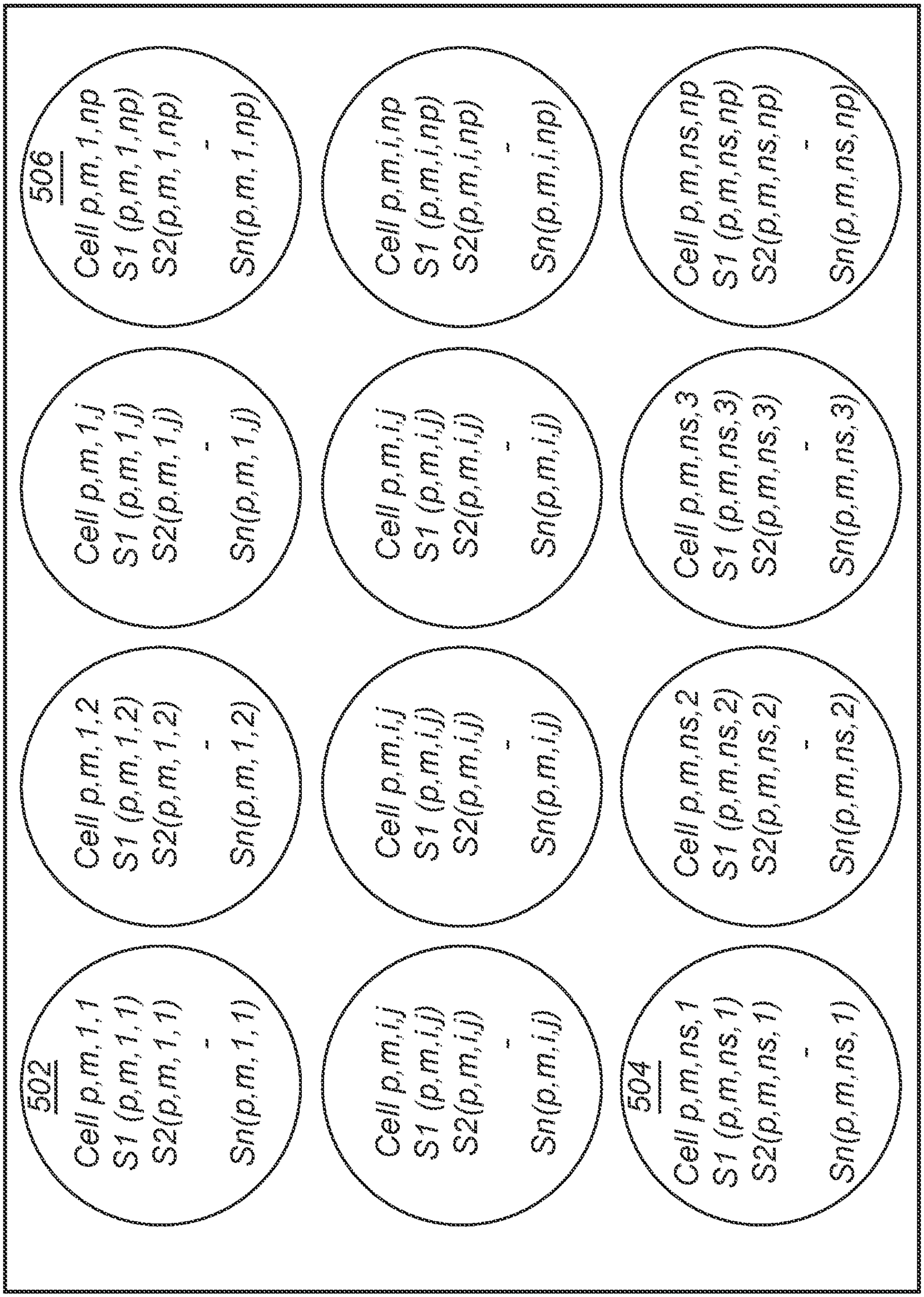
FIG. 5 schematically illustrates indexed similarity values of an electrical energy storage system.

FIG. 5 schematically illustrates a structured set of similarity values, S1, S2, . . . Sn, for cells in pack, p, and module, m, that are storable in an indexed way to associate each cell with their similarity values, here ns number of series connected cells and np number of parallel connected cells are represented.

For example, for electrical energy storage cell 502 (p,m,1,1), located in series connection position 1, and parallel connection position 1, has similarity values S1(p,m,1,1), S2(p,m,1,1), . . . , Sn(p,m,1,1), electrical energy storage cell 504 (p,m,ns,1), located in series connection position ns, and parallel connection position 1, has similarity values S1(p,m,ns,1), S2(p,m,ns,1), . . . , Sn(p,m,ns,1), electrical energy storage cell 506 (p,m,1,np), located in series connection position 1, and parallel connection position np, has similarity values S1(p,m,1,np), S2(p,m,1,np), . . . , Sn(p,m,1,np). It is envisaged that each electrical energy storage cell has a set of more than 2 similarity values, S1-Sn. A final similarity value is calculated for each of the electrical energy storage cell.

In one specific example, the reference data includes initial ageing parameters being initial capacity, initial resistance, and initial heat transfer coefficient of the respective cell, and wherein the usage conditions include temperature, operating voltage, operating current, energy throughput, current throughput, and ambient temperature for each cell, the method hereby comprising: calculating a similarity value for each of the initial ageing parameters, calculating a similarity value for each of the usage conditions; and adapting control strategies for a management system of the electrical energy storage system using the predicted ageing evolution as input to reduce an ageing pace of the electrical energy storage system.

The vehicle 1 may comprise the processor device 102 to perform the method of any of the herein disclosed methods.

There is further provided a computer program product comprising program code for performing, when executed by the processor device, the method of any of the herein disclosed methods. The program code includes code to retrieve reference data of a reference cell, the reference data including at least one initial ageing parameter at beginning of life of the reference cell, and usage conditions of the reference cell including usage condition values, measure at least one initial ageing parameter of each electrical energy storage cell of an electrical energy storage system at beginning of life of each electrical energy storage cell, and at least one usage condition value for each electrical energy storage cell; calculate a first similarity value that indicates a relative relationship between one initial ageing parameter for each electrical energy storage cell and the corresponding initial ageing parameter at beginning of life of the reference cell, calculate a second similarity value that indicates a relative relationship between one usage condition value for each electrical energy storage cell and the corresponding usage condition value of the reference cell, determine a final similarity value for each electrical energy storage cell based on all similarity values of the respective electrical energy storage cell, predict an ageing evolution of each electrical energy storage cell based on the final similarity values, and provide data indicating the ageing evolution of each electrical energy storage cell.

A control system comprising one or more control units configured to perform the method of any of the herein disclosed methods.

There is further provided a non-transitory computer-readable storage medium comprising instructions, which when executed by the processor device, cause the processor device to perform the method of any of the herein disclosed examples. The instructions cause the processor to retrieve reference data of a reference cell, the reference data including at least one initial ageing parameter at beginning of life of the reference cell, and usage conditions of the reference cell including usage condition values, measure at least one initial ageing parameter of each electrical energy storage cell of an electrical energy storage system at beginning of life of each electrical energy storage cell, and at least one usage condition value for each electrical energy storage cell; calculate a first similarity value that indicates a relative relationship between one initial ageing parameter for each electrical energy storage cell and the corresponding initial ageing parameter at beginning of life of the reference cell, calculate a second similarity value that indicates a relative relationship between one usage condition value for each electrical energy storage cell and the corresponding usage condition value of the reference cell, determine a final similarity value for each electrical energy storage cell based on all similarity values of the respective electrical energy storage cell, predict an ageing evolution of each electrical energy storage cell based on the final similarity values, and provide data indicating the ageing evolution of each electrical energy storage cell.

Figure 6:
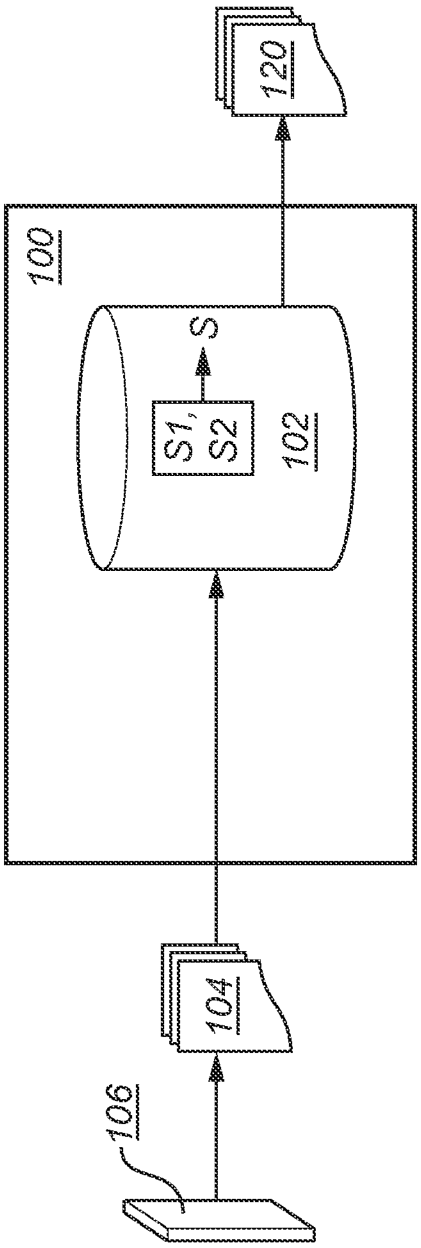
FIG. 6 is another view of FIG. 2, according to another example.

FIG. 6 is another view of FIG. 2, according to another example. FIG. 6 schematically illustrates a computer system 100 comprising a processor device 102 configured to retrieve reference data 104 of a reference cell 106, the reference data including at least one initial ageing parameter at beginning of life of the reference cell 104, and usage conditions of the reference cell including usage condition values, measure at least one initial ageing parameter of each electrical energy storage cell of an electrical energy storage system at beginning of life of each electrical energy storage cell, and at least one usage condition value for each electrical energy storage cell; calculate a first similarity value S1 that indicates a relative relationship between one initial ageing parameter for each electrical energy storage cell and the corresponding initial ageing parameter at beginning of life of the reference cell, calculate a second similarity value S2 that indicates a relative relationship between one usage condition value for each electrical energy storage cell and the corresponding usage condition value of the reference cell, determine a final similarity value S for each electrical energy storage cell based on all similarity values of the respective electrical energy storage cell, predict an ageing evolution of each electrical energy storage cell based on the final similarity values, and, provide data 120 indicating the ageing evolution of each electrical energy storage cell.

Figure 7:
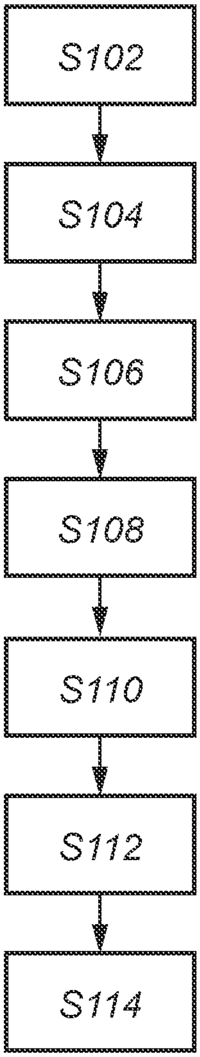
FIG. 7 is a flow chart of an exemplary method to predict ageing of a cell according to one example.

FIG. 7 is a flow chart of a method to predict ageing evolution of an electrical energy storage cell according to one example.

In step S102, retrieving, by a processor device of a computer system, reference data of a reference cell, the reference data including at least one initial ageing parameter at beginning of life of the reference cell, and usage conditions of the reference cell including usage condition values.

In step S104, measuring, by the processor device, at least one initial ageing parameter of each electrical energy storage cell of an electrical energy storage system at beginning of life of each electrical energy storage cell, and at least one usage condition value for each electrical energy storage cell.

In step S106, calculating, by the processor device, a first similarity value that indicates a relative relationship between one measured initial ageing parameter for each electrical energy storage cell and the corresponding initial ageing parameter at beginning of life of the reference cell.

In step S108, calculating, by the processor device, a second similarity value that indicates a relative relationship between one usage condition value for each electrical energy storage cell and the corresponding usage condition value of the reference cell, In step S110, determining, by the processor device, a final similarity value for each electrical energy storage cell based on all similarity values of the respective electrical energy storage cell, In step S112, predicting, by the processor device, an ageing evolution of each electrical energy storage cell based on the final similarity values, and In step S114, providing, by the processor device, data indicating the ageing evolution of each electrical energy storage cell.

Figure 8:
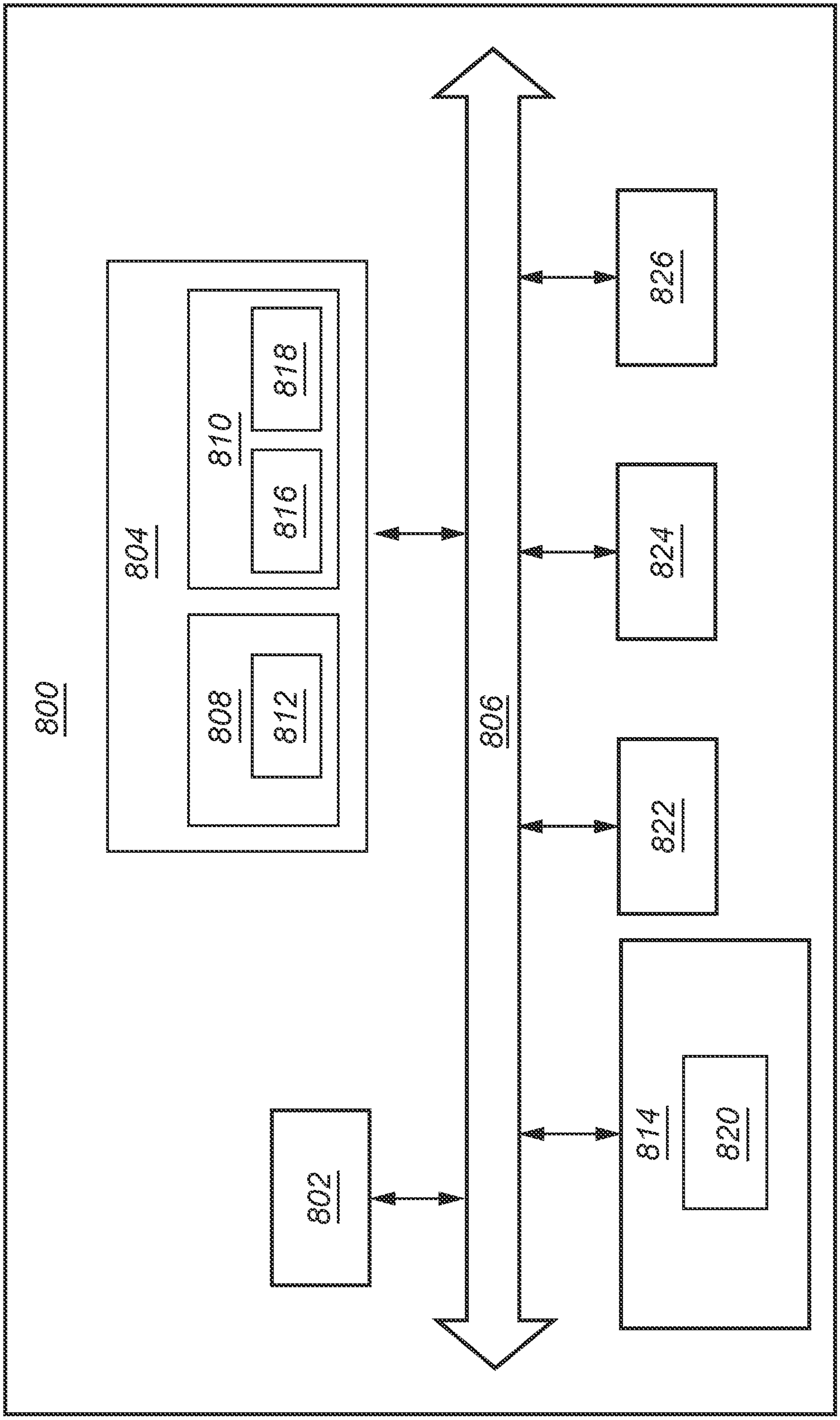
FIG. 8 is a schematic diagram of an exemplary computer system for implementing examples disclosed herein, according to one example.

FIG. 8 is a schematic diagram of a computer system 800 for implementing examples disclosed herein. The computer system 800 is adapted to execute instructions from a computer-readable medium to perform these and/or any of the functions or processing described herein. The computer system 800 may be connected (e.g., networked) to other machines in a LAN, an intranet, an extranet, or the Internet. While only a single device is illustrated, the computer system 800 may include any collection of devices that individually or jointly execute a set (or multiple sets) of instructions to perform any one or more of the methodologies discussed herein. Accordingly, any reference in the disclosure and/or claims to a computer system, computing system, computer device, computing device, control system, control unit, electronic control unit (ECU), processor device, etc., includes reference to one or more such devices to individually or jointly execute a set (or multiple sets) of instructions to perform any one or more of the methodologies discussed herein. For example, control system may include a single control unit or a plurality of control units connected or otherwise communicatively coupled to each other, such that any performed function may be distributed between the control units as desired. Further, such devices may communicate with each other or other devices by various system architectures, such as directly or via a Controller Area Network (CAN) bus, etc.

The computer system 800 may comprise at least one computing device or electronic device capable of including firmware, hardware, and/or executing software instructions to implement the functionality described herein. The computer system 800 may include a processor device 802 (may also be referred to as a control unit), a memory 804, and a system bus 806. The computer system 800 may include at least one computing device having the processor device 802. The system bus 806 provides an interface for system components including, but not limited to, the memory 804 and the processor device 802. The processor device 802 may include any number of hardware components for conducting data or signal processing or for executing computer code stored in memory 804. The processor device 802 (e.g., control unit) may, for example, include a general-purpose processor, an application specific processor, a Digital Signal Processor (DSP), an Application Specific Integrated Circuit (ASIC), a Field Programmable Gate Array (FPGA), a circuit containing processing components, a group of distributed processing components, a group of distributed computers configured for processing, or other programmable logic device, discrete gate or transistor logic, discrete hardware components, or any combination thereof designed to perform the functions described herein. The processor device may further include computer executable code that controls operation of the programmable device.

The system bus 806 may be any of several types of bus structures that may further interconnect to a memory bus (with or without a memory controller), a peripheral bus, and/or a local bus using any of a variety of bus architectures. The memory 804 may be one or more devices for storing data and/or computer code for completing or facilitating methods described herein. The memory 804 may include database components, object code components, script components, or other types of information structure for supporting the various activities herein. Any distributed or local memory device may be utilized with the systems and methods of this description. The memory 804 may be communicably connected to the processor device 802 (e.g., via a circuit or any other wired, wireless, or network connection) and may include computer code for executing one or more processes described herein. The memory 804 may include non-volatile memory 808 (e.g., read-only memory (ROM), erasable programmable read-only memory (EPROM), electrically erasable programmable read-only memory (EEPROM), etc.), and volatile memory 810 (e.g., random-access memory (RAM)), or any other medium which can be used to carry or store desired program code in the form of machine-executable instructions or data structures and which can be accessed by a computer or other machine with a processor device 802. A basic input/output system (BIOS) 812 may be stored in the non-volatile memory 808 and can include the basic routines that help to transfer information between elements within the computer system 800.

The computer system 800 may further include or be coupled to a non-transitory computer-readable storage medium such as the storage device 814, which may comprise, for example, an internal or external hard disk drive (HDD) (e.g., enhanced integrated drive electronics (EIDE) or serial advanced technology attachment (SATA)), HDD (e.g., EIDE or SATA) for storage, flash memory, or the like. The storage device 814 and other drives associated with computer-readable media and computer-usable media may provide non-volatile storage of data, data structures, computer-executable instructions, and the like.

A number of modules can be implemented as software and/or hard-coded in circuitry to implement the functionality described herein in whole or in part. The modules may be stored in the storage device 814 and/or in the volatile memory 810, which may include an operating system 816 and/or one or more program modules 818. All or a portion of the examples disclosed herein may be implemented as a computer program product 820 stored on a transitory or non-transitory computer-usable or computer-readable storage medium (e.g., single medium or multiple media), such as the storage device 814, which includes complex programming instructions (e.g., complex computer-readable program code) to cause the processor device 802 to carry out the steps described herein. Thus, the computer-readable program code can comprise software instructions for implementing the functionality of the examples described herein when executed by the processor device 802. The processor device 802 may serve as a controller or control system for the computer system 800 that is to implement the functionality described herein.

The computer system 800 also may include an input device interface 822 (e.g., input device interface and/or output device interface). The input device interface 822 may be configured to receive input and selections to be communicated to the computer system 800 when executing instructions, such as from a keyboard, mouse, touch-sensitive surface, etc. Such input devices may be connected to the processor device 802 through the input device interface 822 coupled to the system bus 806 but can be connected through other interfaces such as a parallel port, an Institute of Electrical and Electronic Engineers (IEEE) 1394 serial port, a Universal Serial Bus (USB) port, an IR interface, and the like. The computer system 800 may include an output device interface 824 configured to forward output, such as to a display, a video display unit (e.g., a liquid crystal display (LCD) or a cathode ray tube (CRT)). The computer system 800 may also include a communications interface 826 suitable for communicating with a network as appropriate or desired.

The operational steps described in any of the exemplary aspects herein are described to provide examples and discussion. The steps may be performed by hardware components, may be embodied in machine-executable instructions to cause a processor to perform the steps, or may be performed by a combination of hardware and software. Although a specific order of method steps may be shown or described, the order of the steps may differ. In addition, two or more steps may be performed concurrently or with partial concurrence.

Example 1: A computer system comprising a processor device configured to: retrieve reference data of a reference cell, the reference data including at least one initial aging parameter at beginning of life of the reference cell, and usage conditions of the reference cell including usage condition values, measure at least one initial aging parameter of each electrical energy storage cell of an electrical energy storage system at beginning of life of each electrical energy storage cell, and at least one usage condition value for each electrical energy storage cell; calculate a first similarity value that indicates a relative relationship between one initial aging parameter for each electrical energy storage cell and the corresponding initial aging parameter at beginning of life of the reference cell, calculate a second similarity value that indicates a relative relationship between one usage condition value for each electrical energy storage cell and the corresponding usage condition value of the reference cell, determine a final similarity value for each electrical energy storage cell based on all similarity values of the respective electrical energy storage cell, predict an aging evolution of each electrical energy storage cell based on the final similarity values, and provide data indicating the aging evolution of each electrical energy storage cell.

Example 2: A computer-implemented method, comprising: retrieving, by a processor device of a computer system, reference data of a reference cell, the reference data including at least one initial aging parameter at beginning of life of the reference cell, and usage conditions of the reference cell including usage condition values, measuring, by the processor device, at least one initial aging parameter of each electrical energy storage cell of an electrical energy storage system at beginning of life of each electrical energy storage cell, and at least one usage condition value for each electrical energy storage cell; calculating, by the processor device, a first similarity value that indicates a relative relationship between one measured initial aging parameter for each electrical energy storage cell and the corresponding initial aging parameter at beginning of life of the reference cell, calculating, by the processor device, a second similarity value that indicates a relative relationship between one usage condition value for each electrical energy storage cell and the corresponding usage condition value of the reference cell, determining, by the processor device, a final similarity value for each electrical energy storage cell based on all similarity values of the respective electrical energy storage cell, predicting, by the processor device, an aging evolution of each electrical energy storage cell based on the final similarity values, and providing, by the processor device, data indicating the aging evolution of each electrical energy storage cell.

Example 3: The method of example 2, wherein the similarity values for each cell are stored in an indexed way to associate each cell with their similarity values.

Example 4: The method of any of examples 2-3, further comprising: adapting control strategies for a management system of the electrical energy storage system using the predicted aging evolution as input to reduce an ageing pace of the electrical energy storage system.

Example 5: The method of any of examples 2-4, wherein the location of the electrical energy storage cell in the electrical energy storage system relative the other electrical energy storage cells includes one index for the position of the cell in the energy storage system indicative of the pack (pth pack), within the pack indicative of the module (mth module) of the pack, and within the module indicating ith row out of ns cells in series, jth column out of np cells in parallel.

Example 6: The method of any of examples 2-5, wherein the initial aging parameter is one of initial capacity, initial resistance, and initial heat transfer coefficient of the respective cell.

Example 7: The method of example 6, comprising calculating a similarity value for at least two of the initial aging parameters included in the reference data.

Example 8: The method of example 6, comprising calculating a similarity value for each of the initial aging parameters included in the reference data.

Example 9: The method of any of examples 2-8, wherein the usage conditions include temperature of the cell, operating voltage, operating current, energy throughput, current throughput, and ambient temperature, for each cell.

Example 10: The method of example 9, comprising calculating a similarity value for at least two of the usage conditions.

Example 11: The method of example 9, comprising calculating a similarity value for each of the usage conditions.

Example 12: The method of any of examples 9-11, comprising: applying a physical model of the electrical energy storage system layout including active or passive coolant flow for modelling a temperature of each electrical energy storage cell as a function of position of the electrical energy storage cell in the electrical energy storage system, and calculating the corresponding similarity values based on relative relationships between the modelled temperatures of each cell compared to the temperature of the reference cell according to the retrieved usage condition data.

Example 13: The method of any of examples 2-12, comprising: determining, by the processor device, the final similarity value for each cell by a weighted sum of the similarity values of the respective cell.

Example 14: The method of any of examples 2-13, wherein each electrical energy storage cell is assigned a unique similarity value.

Example 15: The method of any of examples 2-14, comprising: processing similarity values for at least two different electrical energy storage cells, and calculating differential aging between at least two electrical energy storage cells from the outcome of the processing.

Example 16: The method of any of examples 2-14, wherein the reference data includes initial aging parameters being initial capacity, initial resistance, and initial heat transfer coefficient of the respective cell, and wherein the usage conditions include temperature, operating voltage, operating current, energy throughput, current throughput, and ambient temperature for each cell, the method comprising: calculating a similarity value for each of the initial aging parameters, calculating a similarity value for each of the usage conditions; and adapting control strategies for a management system of the electrical energy storage system using the predicted aging evolution as input to reduce an ageing pace of the electrical energy storage system.

Example 17: A vehicle comprising the processor device to perform the method of any of examples 2-16.

Example 18: A computer program product comprising program code for performing, when executed by the processor device, the method of any of examples 2-16.

Example 19: A control system comprising one or more control units configured to perform the method of any of examples 2-16.

Example 20: A non-transitory computer-readable storage medium comprising instructions, which when executed by the processor device, cause the processor device to perform the method of any of examples 2-16.

The terminology used herein is for the purpose of describing particular aspects only and is not intended to be limiting of the disclosure. As used herein, the singular forms "a." "an." and "the" are intended to include the plural forms as well, unless the context clearly indicates otherwise. As used herein, the term "and/or" includes any and all combinations of one or more of the associated listed items. It will be further understood that the terms "comprises," "comprising." "includes," and/or "including" when used herein specify the presence of stated features, integers, steps, operations, elements, and/or components, but do not preclude the presence or addition of one or more other features, integers, steps, operations, elements, components, and/or groups thereof.

It will be understood that, although the terms first, second, etc., may be used herein to describe various elements, these elements should not be limited by these terms. These terms are only used to distinguish one element from another. For example, a first element could be termed a second element, and, similarly, a second element could be termed a first element without departing from the scope of the present disclosure.

Relative terms such as "below" or "above" or "upper" or "lower" or "horizontal" or "vertical" may be used herein to describe a relationship of one element to another element as illustrated in the Figures. It will be understood that these terms and those discussed above are intended to encompass different orientations of the device in addition to the orientation depicted in the Figures. It will be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which this disclosure belongs. It will be further understood that terms used herein should be interpreted as having a meaning consistent with their meaning in the context of this specification and the relevant art and will not be interpreted in an idealized or overly formal sense unless expressly so defined herein.

It is to be understood that the present disclosure is not limited to the aspects described above and illustrated in the drawings; rather, the skilled person will recognize that many changes and modifications may be made within the scope of the present disclosure and appended claims. In the drawings and specification, there have been disclosed aspects for purposes of illustration only and not for purposes of limitation, the scope of the inventive concepts being set forth in the following claims.

What is claimed is:

1. A computer system comprising a processor device configured to:

retrieve reference data of a reference cell, the reference data including at least one initial aging parameter at beginning of life of the reference cell, and usage conditions of the reference cell including usage condition values, measure at least one initial aging parameter of each electrical energy storage cell of an electrical energy storage system at beginning of life of each electrical energy storage cell, and at least one usage condition value for each electrical energy storage cell;

calculate a first similarity value that indicates a relative relationship between one initial aging parameter for each electrical energy storage cell and the corresponding initial aging parameter at beginning of life of the reference cell, calculate a second similarity value that indicates a relative relationship between one usage condition value for each electrical energy storage cell and the corresponding usage condition value of the reference cell, determine a final similarity value for each electrical energy storage cell based on all similarity values of the respective electrical energy storage cell, predict an aging evolution of each electrical energy storage cell based on the final similarity values, provide data indicating the aging evolution of each electrical energy storage cell, wherein the usage conditions include temperature of the cell, operating voltage, energy throughput, current throughput, and ambient temperature, for each cell, and comprising:

applying a physical model of a electrical energy storage system layout including active or passive coolant flow for modelling a temperature of each electrical energy storage cell as a function of position of the electrical energy storage cell in the electrical energy storage system, and calculating the corresponding similarity values based on relative relationships between the modelled temperatures of each cell compared to the temperature of the reference cell according to the retrieved usage condition data.

2. A computer-implemented method, comprising:

retrieving, by a processor device of a computer system, reference data of a reference cell, the reference data including at least one initial aging parameter at beginning of life of the reference cell, and usage conditions of the reference cell including usage condition values, measuring, by the processor device, at least one initial aging parameter of each electrical energy storage cell of an electrical energy storage system at beginning of life of each electrical energy storage cell, and at least one usage condition value for each electrical energy storage cell;

calculating, by the processor device, a first similarity value that indicates a relative relationship between one measured initial aging parameter for each electrical energy storage cell and the corresponding initial aging parameter at beginning of life of the reference cell, calculating, by the processor device, a second similarity value that indicates a relative relationship between one usage condition value for each electrical energy storage cell and the corresponding usage condition value of the reference cell, determining, by the processor device, a final similarity value for each electrical energy storage cell based on all similarity values of the respective electrical energy storage cell, predicting, by the processor device, an aging evolution of each electrical energy storage cell based on the final similarity values, providing, by the processor device, data indicating the aging evolution of each electrical energy storage cell, wherein the usage conditions include temperature of the cell, operating voltage, energy throughput, current throughput, and ambient temperature, for each cell, applying a physical model of a electrical energy storage system layout including active or passive coolant flow for modelling a temperature of each electrical energy storage cell as a function of position of the electrical energy storage cell in the electrical energy storage system, and calculating the corresponding similarity values based on relative relationships between the modelled temperatures of each cell compared to the temperature of the reference cell according to the retrieved usage condition data.

3. The method of claim 2, wherein the similarity values for each cell are stored in an indexed way to associate each cell with their similarity values.

4. The method of claim 2, further comprising:

adapting control strategies for a management system of the electrical energy storage system using the predicted aging evolution as input to reduce an ageing pace of the electrical energy storage system.

5. The method of claim 2, wherein a location of the electrical energy storage cell in the electrical energy storage system relative the other electrical energy storage cells includes one index for the position of the cell in the energy storage system indicative of a pack (pth pack), within the pack indicative of a module (mth module) of the pack, and within the module indicating ith row out of ns cells in series, jth column out of np cells in parallel.

6. The method of claim 2, wherein the initial aging parameter is one of initial capacity, initial resistance, and initial heat transfer coefficient of the respective cell.

7. The method of claim 6, comprising calculating a similarity value for at least two of the initial aging parameters included in the reference data.

8. The method of claim 6, comprising calculating a similarity value for each of the initial aging parameters included in the reference data.

9. The method of claim 2, comprising calculating a similarity value for at least two of the usage conditions.

10. The method of claim 2, comprising calculating a similarity value for each of the usage conditions.

11. The method of claim 2, comprising:

determining, by the processor device, the final similarity value for each cell by a weighted sum of the similarity values of the respective cell.

12. The method of claim 2, wherein each electrical energy storage cell is assigned a unique similarity value.

13. The method of claim 2, comprising:

processing similarity values for at least two different electrical energy storage cells, and calculating differential aging between at least two electrical energy storage cells from the outcome of the processing.

14. The method of claim 2, wherein the reference data includes initial aging parameters being initial capacity, initial resistance, and initial heat transfer coefficient of the respective cell, and wherein the usage conditions include temperature, operating voltage, energy throughput, current throughput, and ambient temperature for each cell, the method comprising:

calculating a similarity value for each of the initial aging parameters, calculating a similarity value for each of the usage conditions; and adapting control strategies for a management system of the electrical energy storage system using the predicted aging evolution as input to reduce an ageing pace of the electrical energy storage system.

15. A vehicle comprising the processor device to perform the method of claim 2.

16. A control system comprising one or more control units configured to perform the method of claim 2.

17. A non-transitory computer-readable storage medium comprising instructions, which when executed by the processor device, cause the processor device to perform the method of claim 2.

* * * * *